(12) United States Patent
Cappellani et al.

(10) Patent No.: US 10,424,580 B2
(45) Date of Patent: Sep. 24, 2019

(54) SEMICONDUCTOR DEVICES HAVING MODULATED NANOWIRE COUNTS

(75) Inventors: Annalisa Cappellani, Portland, OR (US); Kelin J. Kuhn, Aloha, OR (US); Rafael Rios, Portland, OR (US); Gopinath Bhimarasetti, Portland, OR (US); Tahir Ghani, Portland, OR (US); Seiyon Kim, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1318 days.

(21) Appl. No.: 13/996,505

(22) PCT Filed: Dec. 23, 2011

(86) PCT No.: PCT/US2011/067223
§ 371 (c)(1),
(2), (4) Date: Jun. 20, 2013

(87) PCT Pub. No.: WO2013/095645
PCT Pub. Date: Jun. 27, 2013

(65) Prior Publication Data
US 2013/0313513 A1    Nov. 28, 2013

(51) Int. Cl.
*H01L 29/775* (2006.01)
*H01L 21/02* (2006.01)
(Continued)

(52) U.S. Cl.
CPC .......... *H01L 27/0886* (2013.01); *B82Y 10/00* (2013.01); *B82Y 40/00* (2013.01);
(Continued)

(58) Field of Classification Search
CPC ...... H01L 29/775; H01L 21/02; H01L 27/088
(Continued)

(56) References Cited

U.S. PATENT DOCUMENTS

2004/0063286 A1*  4/2004  Kim et al. ............... 438/283
2007/0218628 A1*  9/2007  Orlowski et al. ......... 438/254
(Continued)

FOREIGN PATENT DOCUMENTS

KR    1020110121630    11/2011
WO    WO-2010094360    8/2010

OTHER PUBLICATIONS

International Preliminary Report on Patentability from PCT/US2011/067223 dated Jul. 3, 2014, 6 pgs.
(Continued)

*Primary Examiner* — Joseph C. Nicely
*Assistant Examiner* — Lamont B Koo
(74) *Attorney, Agent, or Firm* — Schwabe, Williamson & Wyatt, P.C.

(57) ABSTRACT

Semiconductor devices having modulated nanowire counts and methods to form such devices are described. For example, a semiconductor structure includes a first semiconductor device having a plurality of nanowires disposed above a substrate and stacked in a first vertical plane with a first uppermost nanowire. A second semiconductor device has one or more nanowires disposed above the substrate and stacked in a second vertical plane with a second uppermost nanowire. The second semiconductor device includes one or more fewer nanowires than the first semiconductor device. The first and second uppermost nanowires are disposed in a same plane orthogonal to the first and second vertical planes.

25 Claims, 10 Drawing Sheets

(51) Int. Cl.
  *H01L 27/088* (2006.01)
  *B82Y 10/00* (2011.01)
  *B82Y 40/00* (2011.01)
  *H01L 29/66* (2006.01)
  *H01L 29/06* (2006.01)
  *H01L 29/423* (2006.01)
  *H01L 29/78* (2006.01)
  *H01L 29/786* (2006.01)
  *H01L 29/16* (2006.01)
  *B82Y 99/00* (2011.01)

(52) U.S. Cl.
  CPC .... *H01L 21/02587* (2013.01); *H01L 29/0673* (2013.01); *H01L 29/42392* (2013.01); *H01L 29/66439* (2013.01); *H01L 29/775* (2013.01); *H01L 29/785* (2013.01); *H01L 29/78696* (2013.01); *B82Y 99/00* (2013.01); *H01L 29/16* (2013.01); *H01L 2924/0002* (2013.01)

(58) Field of Classification Search
  USPC ............................................. 257/9; 438/479
  See application file for complete search history.

(56) References Cited

U.S. PATENT DOCUMENTS

| | | |
|---|---|---|
| 2008/0128797 A1 | 6/2008 | Dyer et al. |
| 2010/0193770 A1* | 8/2010 | Bangsaruntip et al. ........ 257/24 |
| 2010/0207208 A1 | 8/2010 | Bedell et al. |
| 2010/0295022 A1* | 11/2010 | Chang et al. ................... 257/24 |
| 2011/0031473 A1 | 2/2011 | Chang et al. |
| 2011/0233522 A1 | 9/2011 | Cohen et al. |
| 2012/0007052 A1* | 1/2012 | Hobbs et al. ................... 257/24 |
| 2013/0153993 A1* | 6/2013 | Chang et al. ................. 257/330 |

OTHER PUBLICATIONS

Office Action and Search Report for Taiwan Patent Application No. 101148054, dated Oct. 14, 2014, 3 pgs.
International Search Report and Written Opinion for PCT Patent Application No. PCT/US2011/067223 dated Sep. 14, 2012, 9 Pages.
Office Action for Korean Patent Application No. 10-2014-7017256, dated Jul. 17, 2015, 6 pgs.
Notice of Preliminary Rejection for Korean Patent Application No. 10-2016-7009173 dated Jan. 18, 2017, 7 pgs., with English translation.

* cited by examiner

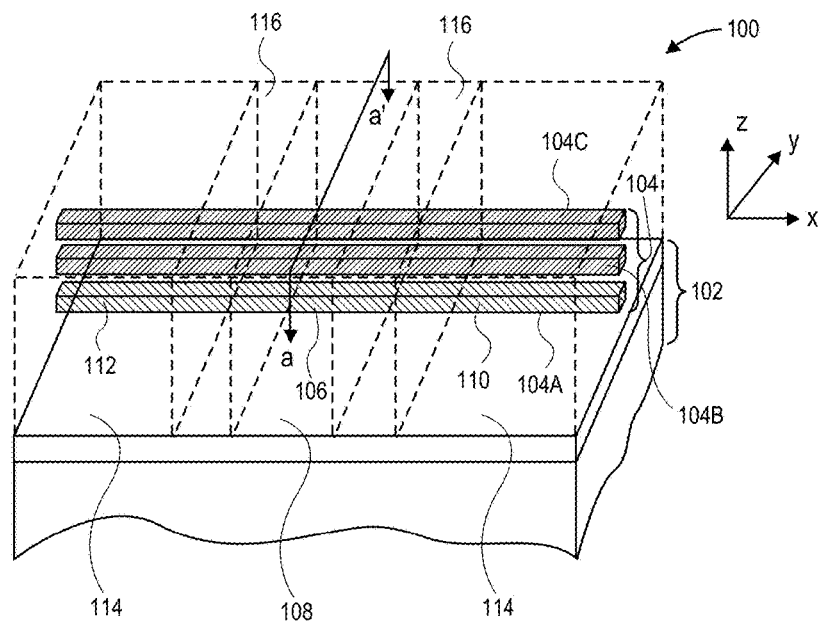
FIG. 1A
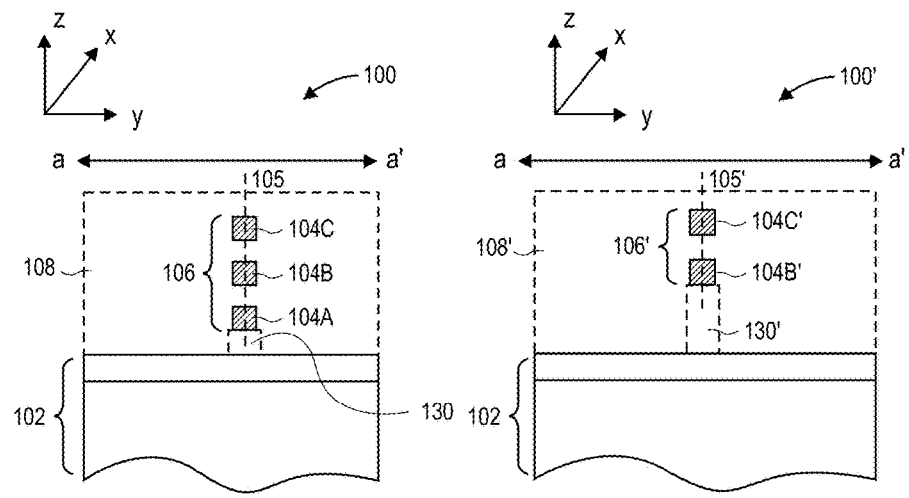
FIG. 1B  FIG. 1B'

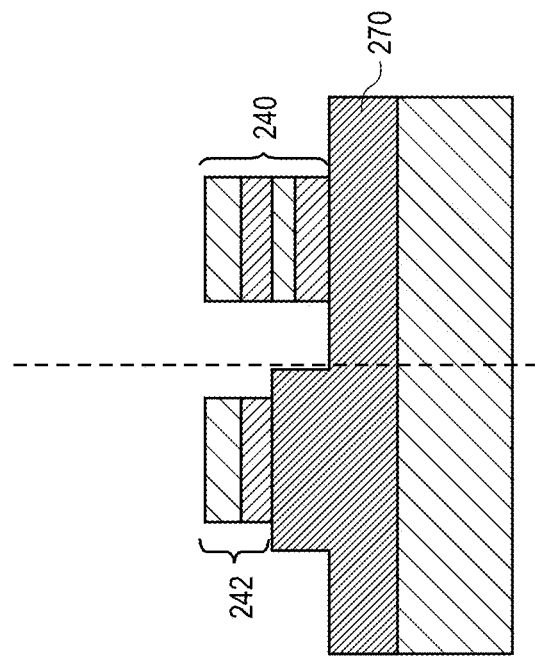
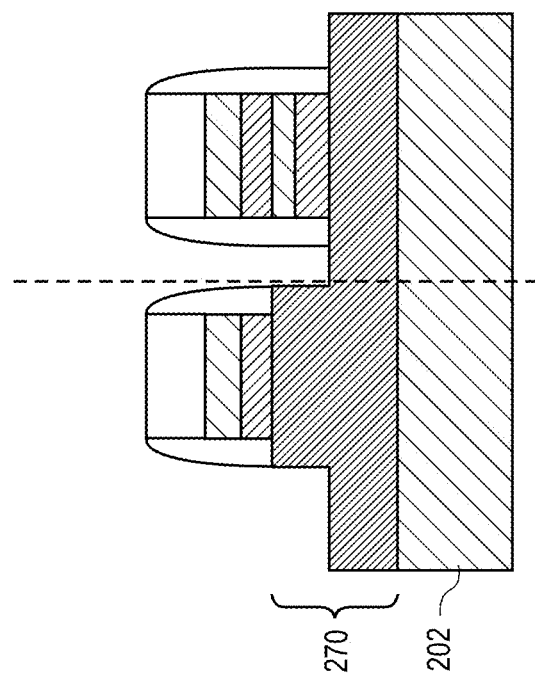

SEMICONDUCTOR DEVICES HAVING MODULATED NANOWIRE COUNTS

CLAIM OF PRIORITY

This application is a U.S. National Phase application under 35 U.S.C. § 371 of International Application No. PCT/US2011/067223, filed Dec. 23, 2011, entitled "SEMICONDUCTOR DEVICES HAVING MODULATED NANOWIRE COUNTS," the entire contents of which are incorporated herein by reference.

TECHNICAL FIELD

Embodiments of the invention are in the field of nanowire semiconductor devices and, in particular, semiconductor devices having modulated nanowire counts and methods to form such devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Maintaining mobility improvement and short channel control as microelectronic device dimensions scale past the 15 nanometer (nm) node provides a challenge in device fabrication. Nanowires used to fabricate devices provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example.

Many different techniques have been attempted to fabricate and size nanowire-based devices. However, significant improvements are still needed in the area of Z-modulation for such semiconductor devices.

SUMMARY

Embodiments of the present invention include semiconductor devices having modulated nanowire counts and methods to form such devices.

In an embodiment, a semiconductor structure includes a first semiconductor device having a plurality of nanowires disposed above a substrate and stacked in a first vertical plane with a first uppermost nanowire. A second semiconductor device has one or more nanowires disposed above the substrate and stacked in a second vertical plane with a second uppermost nanowire. The second semiconductor device includes one or more fewer nanowires than the first semiconductor device. The first and second uppermost nanowires are disposed in a same plane orthogonal to the first and second vertical planes.

In another embodiment, a semiconductor structure includes a first semiconductor device having a first plurality of nanowires disposed above a substrate and stacked in a first vertical plane with a first uppermost nanowire. A second semiconductor device has a second plurality of nanowires disposed above the substrate and stacked in a second vertical plane with a second uppermost nanowire. The second semiconductor device includes one or more fewer nanowires than the first semiconductor device. A third semiconductor device has one or more nanowires disposed above the substrate and stacked in a third vertical plane with a third uppermost nanowire. The third semiconductor device includes one or more fewer nanowires than the second semiconductor device. The first, second and third uppermost nanowires are disposed in a same plane orthogonal to the first, second and third vertical planes.

In another embodiment, a method of fabricating a nanowire semiconductor structure includes forming a stack of semiconductor layers above a substrate. The stack of semiconductor layers includes a plurality of active layers. A first fin is formed from a first region of the stack of semiconductor layers. The first fin includes patterned portions of two or more of the active layers. A second fin is formed from a second region of the stack of semiconductor layers. The second fin includes patterned portions of one or more fewer of the active layers than the first fin. A dielectric layer is formed below the second fin. First and second semiconductor devices are formed from the first and second fins, respectively.

BRIEF DESCRIPTION OF THE DRAWINGS

FIG. 1A illustrates a three-dimensional cross-sectional view of nanowire-based semiconductor devices, in accordance with an embodiment of the present invention.

FIG. 1B illustrates a cross-sectional view of a nanowire-based semiconductor device of FIG. 1A, as taken along the a-a' axis, in accordance with an embodiment of the present invention.

FIG. 1B' illustrates a cross-sectional view of another nanowire-based semiconductor device of FIG. 1A, as taken along the a-a' axis, in accordance with another embodiment of the present invention.

FIGS. 2A-2G illustrate cross-sectional views representing various operations in a method of fabricating a nanowire semiconductor structure, in accordance with an embodiment of the present invention.

DETAILED DESCRIPTION

Figure 2A:
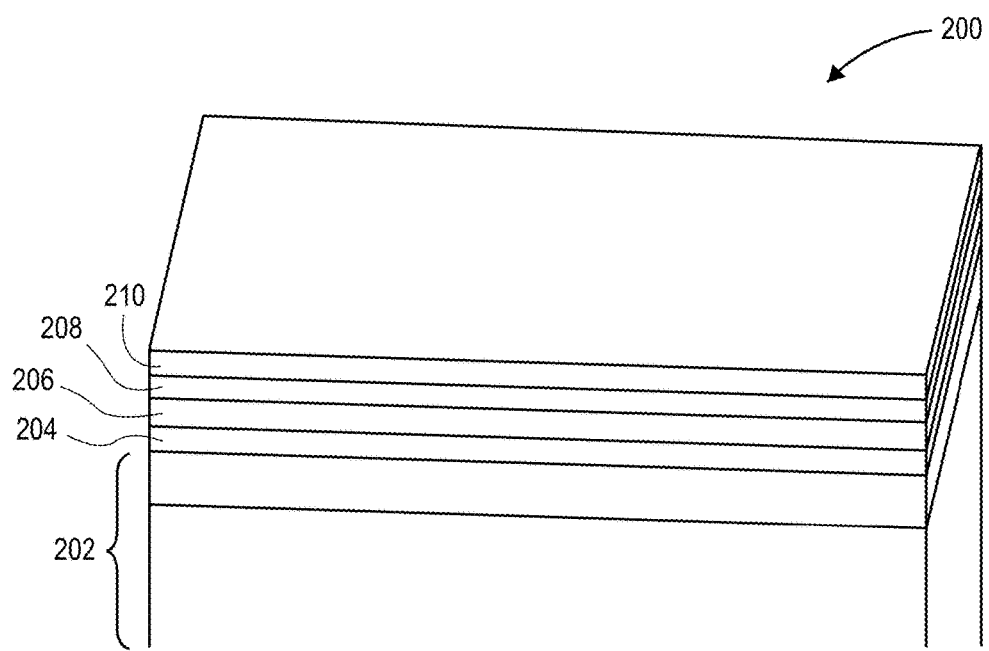

Semiconductor devices having modulated nanowire counts and methods to form such devices are described. In the following description, numerous specific details are set forth, such as specific nanowire integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are effectively directed at selective nanowire removal for devices fabricated from a plurality of nanowires. Such embodiments may enable the fabrication of nanowires-based devices with varying Z (e.g., varying active region area). In one such embodiment, the number of nanowires to be included in a specific device is determined during a fin precursor patterning operation, where a certain number of active layers are patterned for a given Z (also referred to as Zwa, or Z of the width of the active region). Devices may be fabricated with different numbers of nanowires within certain devices, all on a common substrate.

Embodiments of the present invention may be described as selective nanowire removal, or as a predetermined fabrication count during active region patterning. Viewed either way, a first device with a first Z value having a first count of nanowires therein can be fabricated on the same substrate as a second device with a second Z value having a second count of nanowires therein. With respect to making an analogy with other three-dimensional devices, the varying number of nanowires may be viewed as Z modulation or as $H_{Si}$ (silicon height) modulation. In an embodiment, a spacer technique is used to select the number of nanowires to be fabricated and included as active diffusion in a fin structure.

In circuit design, it may be critical to enable the ability to balance the drive strength of various transistors relative to each other in order to optimize an N/P ratio. Such optimization may achieve robust circuit functionality and/or improve circuit performance and power trade-offs. In SRAM memory cell design, Vccmin is strongly affected or impacted by having the correct cell balance. Transistor drive strength is typically varied by selecting the transistor width (Zwa in case of 3D FinFET, tri-gate, or nanowire device). In planar devices, transistor drive strength may be readily modulated for a by drawing a shorter or longer physical width (Z) during layout. By contrast, for tri-gate or FinFET devices, the transistor Z is usually varied by choosing the number of fins per device. However, as fins get taller, the available Z for such quantized fin counts is manifested in larger quantum increments, leading to the possibility of unoptimized circuit operation.

Accordingly, one or more embodiments described herein involve the building of a spacer around nanowire stack FIN sidewalls in order to expose the selected area to be converted to a dielectric. The number of active areas protected by the spacer ultimately corresponds to the number of nanowires fabricated for a given device. In an embodiment, the number of nanowires for a pair of devices fabricated on the same substrate differs, enabling modulation of the active area, hence Z, of the two devices. Thus, nanowires are effectively selectively removed (or merely not fabricated to begin with) from any conduction and, so, the $H_{Si}$ of one fin (which ultimately become nanowire stacks) is independently modulated from another on the same wafer. In an embodiment, such modulation permits fabrication of a single SRAM template to support a variety of different process variants (e.g., SP, LP, GP) without changes to an existing plate set.

In an embodiment methods to achieve nanowire count modulation involve a cut in the diffusion fin area from the bottom up, which enables a reduction in parasitic capacitance as compared with a method which otherwise cuts the diffusion fin from the top in a replacement gate process flow. In one embodiment, the isolation of subfins with bulk silicon starting material is performed by using an under fin oxidation (UFO) process. Spacer formation with modulated height allows use of this approach to provide varied nanowire counts, as opposed to resulting in a constant fin height across the product die and so to an equal number of nanowires. In a specific such embodiment, modulation of the number of active nanowires is performed at the FIN etch area, with removal occuring under the source and drain regions as well as and under the channel. More details regarding specific methods are described in association with FIGS. 2A-2G, 3, 4 and 5A-5H below.

Thus, in an aspect, devices with nanowire count modulation on a common substrate are provided by approaches described herein. In an example, FIG. 1A illustrates a three-dimensional cross-sectional view of nanowire-based semiconductor devices 100 and 100', in accordance with an embodiment of the present invention. FIG. 1B illustrates a cross-sectional view of the nanowire-based semiconductor device 100 of FIG. 1A, as taken along the a-a' axis. FIG. 1B' illustrates a cross-sectional view of the nanowire-based semiconductor device 100' of FIG. 1A, as taken along the a-a' axis.

Referring to FIG. 1A, a semiconductor device 100 or 100' includes one or more vertically stacked nanowires (104 set) disposed above a substrate 102. Embodiments herein are targeted at both multiple wire devices and single wire devices. As an example, a three nanowire-based device 100 having nanowires 104A, 104B and 104C is shown. In another example, a two nanowire-based device 100' having nanowires 104B and 104C is shown (that is, nanowire 104A is excluded from device 100', as depicted with the different shading for 104A). For convenience of description, nanowire 104C is used as an example where description is focused on only one of the nanowires. It is to be understood that where attributes of one nanowire are described, embodiments based on a plurality of nanowires may have the same attributes for each of the nanowires.

In an embodiment, a common substrate has disposed thereon devices with differing nanowire counts. For example, semiconductor device 100 and 100' may be included on the same substrate. The former device has a nanowire count of three, while the latter device has a nanowire count of two. The devices are elaborated in FIGS. 1B and 1B'. It is to be understood that embodiments herein may contemplate any counts between devices, so long as the counts differ by one or more nanowires for devices having a different "count," and hence different Z.

Referring to FIG. 1B, a semiconductor structure including both devices 100 and 100' from FIG. 1A includes a first semiconductor device 100 having a plurality of nanowires (three: 104A, 104B, and 104C) disposed above the substrate 102 and stacked in a first vertical plane 105 with an uppermost nanowire 104C. Referring to FIG. 1B', a second semiconductor device 100' has one or more nanowires (two: 104B' and 104C') disposed above the substrate 102 and stacked in a second vertical plane 105' with an uppermost nanowire 104C'. The second semiconductor device 100' includes one or more fewer nanowires than the first semiconductor device 100, e.g., two nanowires instead of three as shown in this particular example. The first and second uppermost nanowires 104C and 104C', respectively, are disposed in a same plane as one another, orthogonal to the first and second vertical planes 105 and 105'. That is, the nanowires 104C and 104C' are equally spaced above the common substrate 102.

As depicted in FIGS. 1A, 1B and 1B', in an embodiment, each of the nanowires has a discrete channel region 106. The channel region 106 is discrete in that it is completely surrounded by the gate electrode stack 108 (described below) without any intervening material such as underlying substrate material or overlying channel fabrication materials. Accordingly, in embodiments having a plurality of nanowires 104, the channel regions 106 of the nanowires are also discrete relative to one another, as depicted in FIGS. 1B and 1B'. In one such embodiment, each of the nanowires also includes a pair of discrete source and drain regions 110 and 112, as down in FIG. 1A. That is, the source/drain regions 110/112 are completely surrounded by the contacts 114 (described below) without any intervening material such as underlying substrate material or overlying channel fabrication materials. Accordingly, in such an embodiment having a plurality of nanowires 104, the source/drain regions 110/112 of the nanowires are also discrete relative to one another. In an alternative such embodiment (not shown), however, the stacks of nanowires include a pair of non-discrete source and drain regions.

Substrate 102 may be composed of a material suitable for semiconductor device fabrication. In one embodiment, substrate 102 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxy-nitride is disposed on the lower bulk substrate. Thus, the structure 100 may be fabricated from a starting semiconductor-on-insulator substrate or may be formed to have such an insulating layer during fabrication of the nanowires, as described in greater detail below. FIGS. 1A, 1B and 1B' depict substrate 102 as having a lower bulk crystalline portion and an upper insulating portion.

Alternatively, the structure 100 is formed directly from a bulk substrate and local oxidation is used to form electrically insulative portions in place of the above described upper insulator layer. In another alternative embodiment, the structure 100 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 104 may be sized as wires or ribbons, and may have squared-off or rounder corners. In an embodiment, the nanowires 104 are composed of a material such as, but not limited to, silicon, germanium, or a combination thereof. In one such embodiment, the nanowires are single-crystalline. For example, for a silicon nanowire 104, a single-crystalline nanowire may be based from a (100) global orientation, e.g., with a <100> plane in the z-direction. In an embodiment, the dimensions of the nanowires 104, from a cross-sectional perspective, are on the nano-scale. For example, in a specific embodiment, the smallest dimension of the nanowires 104 is less than approximately 20 nanometers. In an embodiment, the nanowires 104 are composed of a strained material, particularly in the channel regions 106. The width and height of each of the channel regions 106 is shown as approximately the same in FIGS. 1B and 1B', however, they need not be. For example, in another embodiment (not shown), the width of the nanowires 104 is substantially greater than the height. In a specific embodiment, the width is approximately 2-10 times greater than the height. Nanowires with such geometry may be referred to as nanoribbons. In an alternative embodiment (also not shown), the nanoribbons are oriented vertically. That is, each of the nanowires 104 has a width and a height, the width substantially less than the height.

Referring to FIGS. 1B and 1B', in an embodiment, semiconductor devices 100 and 100' further include an intervening dielectric layer 130 or 130', respectively, disposed between the substrate 102 and the bottom nanowire (104A or 104B', respectively. As such, the intervening dielectric layer 130 or 130' is thicker between the substrate 102 and the semiconductor device 100' than between the substrate 102 and the semiconductor device 100. In such embodiments, at least a portion of the lowermost nanowire of the device is not discrete, either at the source/drain region, the channel region, or both. The intervening dielectric layer 130 or 130' may be an artifact of the fabrication process used to provide modulated nanowire count structures. It is to be understood that although possibly present during partial fabrication, any intervening dielectric layer 130 or 130' may be removed prior to completion of a semiconductor device. Formation of such an intervening dielectric layer 130 or 130' is described in greater detail below.

Referring to FIGS. 1A, 1B and 1B', in an embodiment, the semiconductor devices 100 or 100' further include respective gate electrode stacks 108 or 108' surrounding a portion of each of the plurality of nanowires of the device. In one such embodiment, the gate electrode stacks 108 or 108' each include a gate dielectric layer and a gate electrode layer (not shown). In an embodiment, the gate electrode of gate electrode stack 108 or 108' is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 104. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Referring again to FIG. 1A, in an embodiment, the semiconductor devices 100 or 100' further first and second contacts 114 surrounding respective portions of each of the plurality of nanowires 104. The contacts 114 are, in an embodiment, fabricated from a metal species. The metal species may be a pure metal, such as nickel or cobalt, or may be an alloy such as a metal-metal alloy or a metal-semiconductor alloy (e.g., such as a silicide material).

In an embodiment, the semiconductor devices 100 or 100' further include first and second spacers 116 disposed between the gate electrode stack 108 and the first and second contacts 114, respectively, as depicted in FIG. 1A. As described above, the channel regions and the source/drain regions of the nanowires 104 are, in at least several embodiments, made to be discrete. However, not all regions of the nanowires 104 need be, or even can be made to be discrete. For example, nanowires 104A-104C may not be discrete at the location under spacers 116. In one embodiment, the stack of nanowires 104A-104C have intervening semiconductor material there between, such as silicon germanium intervening between silicon nanowires, or vice versa, as described below in association with FIGS. 2A-2G, 3, 4 and 5A-5H. Thus, in an embodiment, a portion of the plurality of vertically stacked nanowires under one or both of the spacers is non-discrete. In an embodiment, the spacers 116 are composed of an insulative dielectric material such as, but not limited to, silicon dioxide, silicon oxy-nitride or silicon nitride.

Although the device 100 or 100' described above is for a single device, e.g., an NMOS or a PMOS device, a CMOS architecture may also be formed to include both NMOS and PMOS nanowire-based strained channel devices disposed on or above the same substrate. A plurality of such NMOS devices, however, may be fabricated to have different nanowire counts. Likewise, a plurality of such PMOS devices may be fabricated to have different nanowire counts. In an embodiment, semiconductor devices 100 and 100' are formed on a common substrate, have nanowires composed of silicon, and are both NMOS devices. In another embodiment, semiconductor devices 100 and 100' are formed on a common substrate, have nanowires composed of silicon germanium, and are both PMOS devices. In an embodiment, referring to FIGS. 1B and 1B', the first and second vertical planes 105 and 105', respectively, are parallel to one another.

Nanowire count modulation may, in an embodiment, be achieved by initiating fabrication on a bulk silicon substrate, depositing nanowire stack layers, and patterning a fin using a spacer patterning technique by selective masking an area to be etched. The etching of the fin is performed to the depth needed for subfin isolation (e.g., an operation that sets the numbers of wires as active) for a particular structure. In one such embodiment, two different depths are achieved, as described in association with FIGS. 2A-2G. In another embodiment, three different depths are achieved, as described in association with FIGS. 5A-5H.

Thus, in another aspect, methods of fabricating a nanowire semiconductor structure are provided. For example, FIGS. 2A-2G, 3 and 4 illustrate cross-sectional views representing various operations in a method of fabricating a nanowire semiconductor structure, in accordance with an embodiment of the present invention.

Referring to FIG. 2A, a method of fabricating a nanowire semiconductor structure includes forming a stack of semiconductor layers above a substrate 202. The stack of semiconductor layers 202 includes a plurality of active layers. In one such embodiment, the active layers are active layer pairs (204 and 208, or 206 and 210) with intervening fabrication layers (the opposing 206 and 210, or 204 and 208), as depicted in FIG. 2A. In an embodiment, the substrate 202 is a bulk crystalline substrate such as a bulk silicon substrate and layer 204 is disposed directly on the bulk crystalline substrate. In another embodiment, an intervening dielectric layer is already present (shown as optional layer in FIG. 2A). However, the remainder of FIGS. 2B-2G assume a bulk crystalline substrate with no preformed intervening dielectric layer. In one such embodiment, substrate 202 is a bulk crystalline silicon substrate, and the stack of active layers is formed directly on the bulk crystalline silicon substrate. In a particular such embodiment, layers 204 and 208 are composed of silicon germanium, while layers 206 and 210 are composed of silicon.

Figure 2B:
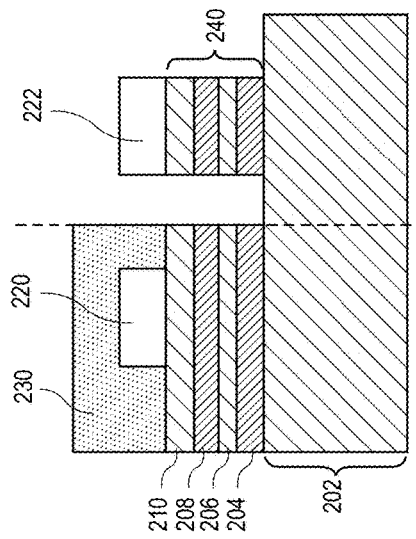

Referring to FIG. 2B, prior to fin etch, a first hardmask layer 220 and a second hardmask layer 222 are formed above the stack of layers 204-210. A masking layer 230 is formed to cover a region including hardmask layer 220. In FIGS. 2B-2G, for convenience, a dashed line is used to distinguish two different regions of a common substrate 202. The regions may be in contact with one another, e.g., as if the dashed line were not present, or may be separated from one another.

Figure 2C:
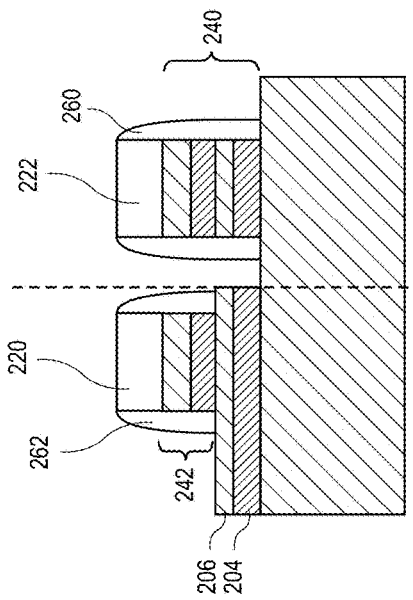
Figure 2D:
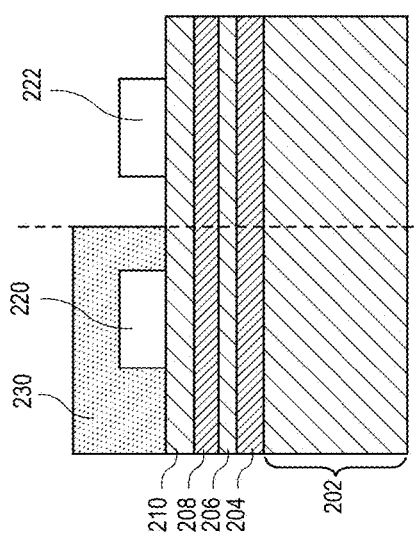

The portion of the stack of layers 204-210 not protected by masking layer 230 is then patterned to have the pattern of hardmask 222 and to form fin 240, as depicted in FIG. 2C. Referring to FIG. 2D, fin 240 and (if still present) hardmask 222 are covered with a masking layer 250. Additionally, masking layer 230 is removed and the portions of layers 208 and 210 not protected by masking layer 250 are then patterned to have the pattern of hardmask 220 and to form fin 242. However, the etch is not performed on layer 204 and 206.

Figure 2E:
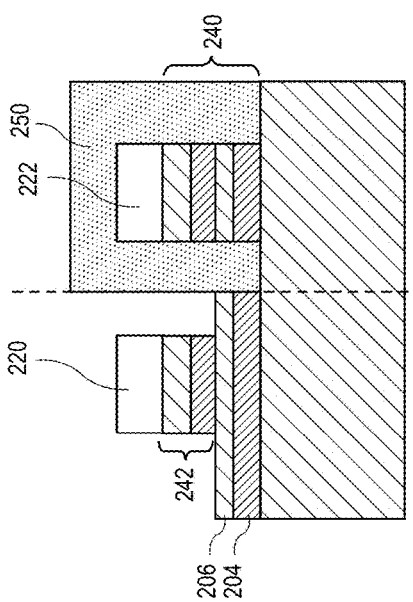
Figure 3:
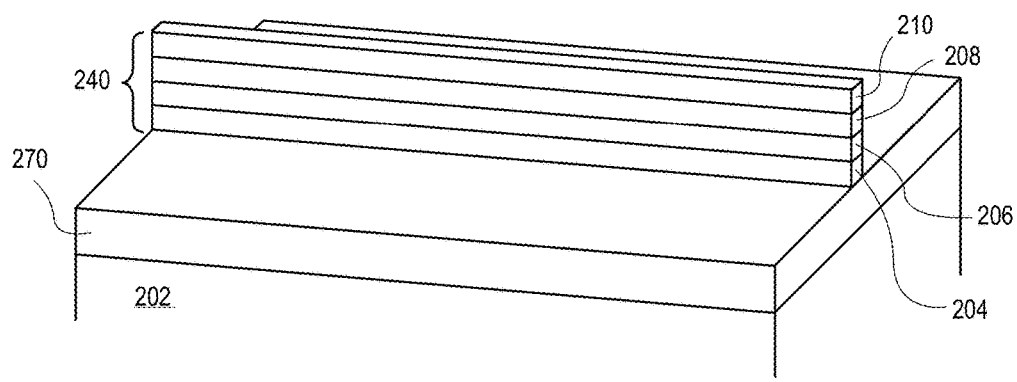
FIG. 3 illustrates a cross-sectional view representing an operation in a method of fabricating a nanowire semiconductor structure, in accordance with an embodiment of the present invention.
Figure 4:
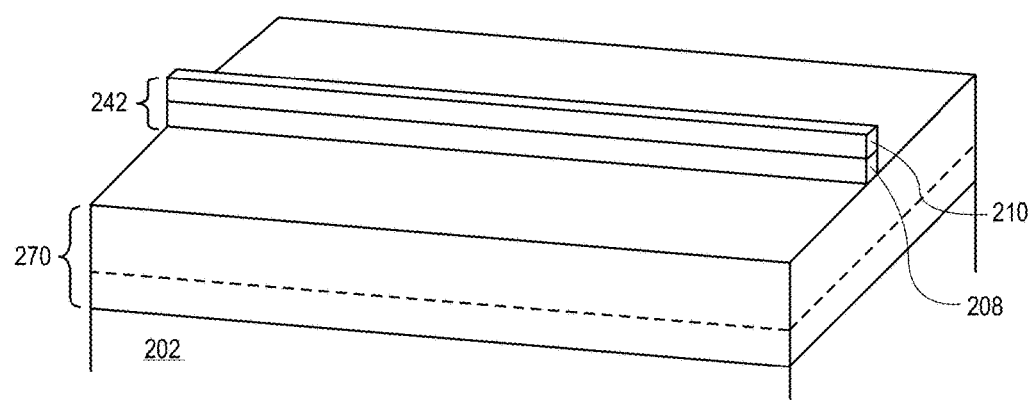
FIG. 4 illustrates a cross-sectional view representing an operation in a method of fabricating a nanowire semiconductor structure, in accordance with an embodiment of the present invention.

Referring to FIG. 2E, masking layer 250 is removed and a first set of dielectric spacers 260 is formed along the sidewalls of fin 240, while a second set of dielectric spacers 262 is formed along the sidewalls of fin 242. It is to be understood that, in the case where the structures are directly adjacent, a sidewall spacer may form along the sidewalls of the exposed portions of layers 204 and 206. The exposed portions of layers 204 and 206 (those portions not protected by spacers 260 or 262), along with a top portion of substrate 202, are then oxidized to form an intervening dielectric layer 270, as depicted in FIG. 2F. Then, referring to FIG. 2G, any remaining hardmask layers and sidewall spacers are removed to provide fin 240 and fin 242 above intervening dielectric layer 270. FIG. 3 depicts another view of fin 240, while FIG. 4 depicts another view of fin 242. It is noted that the portion of intervening dielectric layer 270 under fin 242 is thicker than the portion of intervening dielectric layer 270 under fin 240 by an amount indicated by the dashed line in FIG. 4.

Referring again to FIG. 2F, in an embodiment, the exposed portions of layers 204 and 206 along with a top portion of substrate 202 are oxidized to form the intervening dielectric layer 270 by "under fin oxidation" (UFO). In an embodiment, the use of spacers may be required if a same or like material is being oxidized, and may even be included if non-like materials are used. In an embodiment, an oxidizing atmosphere or an adjacent oxidizing material may be used for UFO. However, in another embodiment, oxygen implant is used. In some embodiments, a portion of a material is recessed prior to UFO which may reduce the extent of so-called birds-beak formation during oxidation. Thus, the oxidation may be performed directly, by recessing first, or by oxygen implant, or a combination thereof.

Referring again to FIGS. 3 and 4, the method thus includes forming a first fin 240 from a first region of the stack of semiconductor layers. The first fin includes patterned portions of two or more of the active layers. A second fin 242 is formed from a second region of the stack of semiconductor layers. The second fin includes patterned portions of one or more fewer of the active layers than the first fin. A dielectric layer is formed below the second fin and, possibly, below the first fin as well.

First and second semiconductor devices may then be formed from the first and second fins 240 and 242, respectively. In an embodiment, forming the first semiconductor device includes forming a plurality of nanowires having discrete portions, and forming the second semiconductor device includes forming one or more nanowires also having discrete portions. The wires may be made discrete by having gate placeholders in place or by having source and drain regions strapped down, or both at different processing stages. For example, in an embodiment, the silicon layers 206 and 210 are etched selectively with a wet etch that selectively removes the silicon 206/210 while not etching the silicon germanium nanowire structures 204 and 208. Such etch chemistries as aqueous hydroxide chemistries, including ammonium hydroxide and potassium hydroxide, for example, may be utilized to selectively etch the silicon. In another embodiment, the silicon germanium layers 204 and 208 are etched selectively with a wet etch that selectively removes the silicon germanium while not etching the silicon nanowire structures 206 and 210. Such etch chemistries as carboxylic acid/nitric acid/HF chemistry, and citric acid/nitric acid/HF, for example, may be utilized to selectively etch the silicon germanium. Thus, either the silicon layers may be removed from the fin-type structures 240 or 242 to form silicon germanium nanowires, or the silicon germanium layers may be removed from the fin-type structures 240 or 242 to form silicon channel nanowires.

In an embodiment, as described in association with FIG. 2F, forming the dielectric layer below the second fin includes oxidizing one or more of the semiconductor layers in the second region of the stack of semiconductor layers, below the second fin. In one such embodiment, the stack of semiconductor layers is formed on the substrate, and the method further comprises oxidizing portions of the substrate below both the first and second fins.

In an embodiment, the method further includes forming a third fin from a third region of the stack of semiconductor layers, the third fin comprising patterned portions of one or more fewer of the active layers than the second fin. A dielectric layer is then below the third fin. A third semiconductor device is then formed from the third fin. For example, FIGS. 5A-5H illustrate cross-sectional views representing various operations in a method of fabricating a nanowire semiconductor structure, in accordance with an embodiment of the present invention.

Figure 5A:
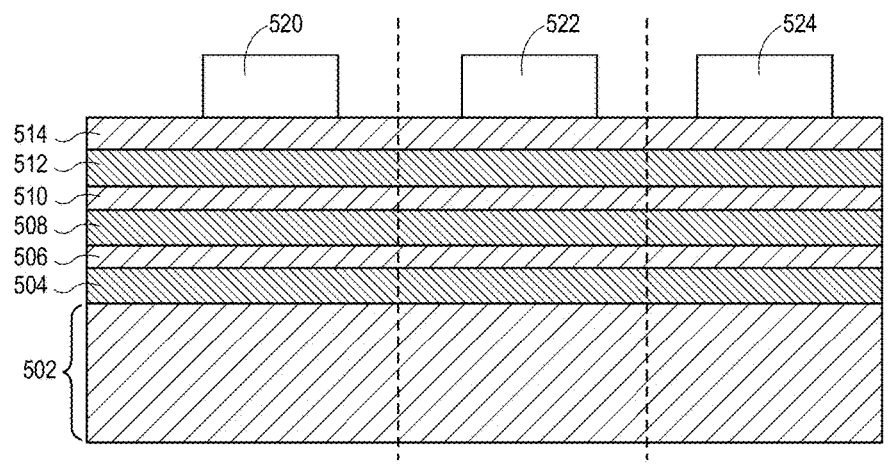
FIGS. 5A-5H illustrate cross-sectional views representing various operations in a method of fabricating a nanowire semiconductor structure, in accordance with an embodiment of the present invention.
Figure 5B:
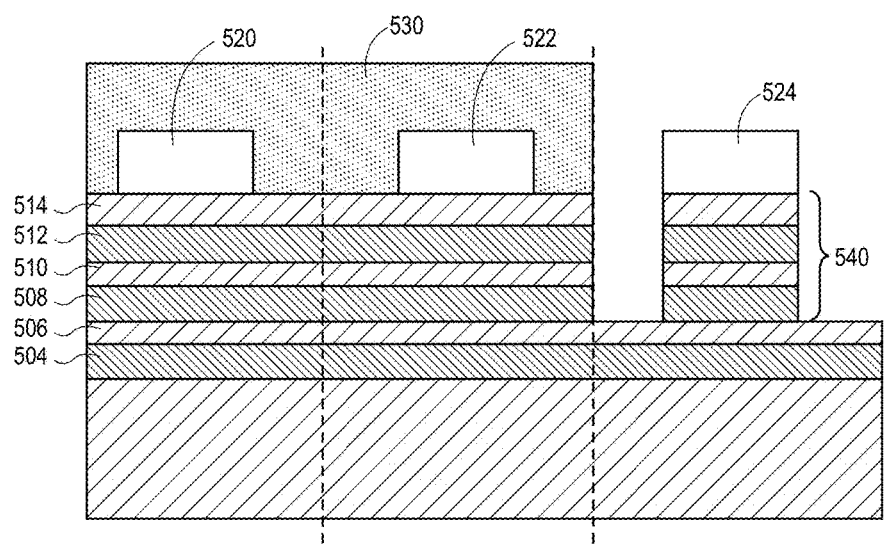

Referring to FIG. 5A, prior to fin etch, a first hardmask layer 520, a second hardmask layer 522, and a third hardmask layer 524 are formed above a stack of active and intervening layers 504, 506, 508, 510, 512 and 514 formed above a substrate 502. A masking layer 530 is then formed to cover a region including hardmask layers 520 and 522, as depicted in FIG. 5B. In FIGS. 5A-5H, for convenience, dashed lines are used to distinguish three different regions of a common substrate 502. The regions may be in contact with one another, e.g., as if the dashed lines were not present, or may be separated from one another.

Figure 5C:
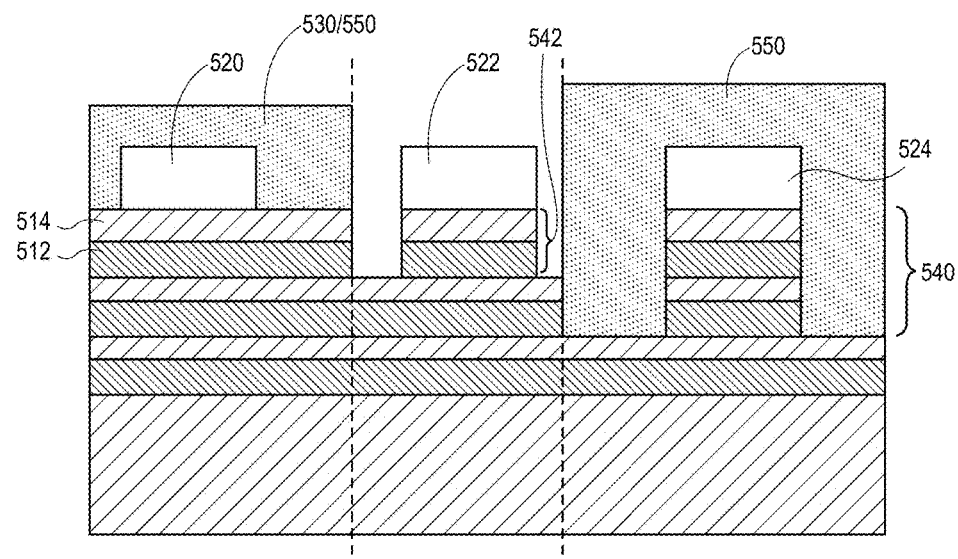

The portions of the layers 508-514 not protected by masking layer 530 are then patterned to have the pattern of hardmask 524 and to form fin 540, as depicted in FIG. 5B. Referring to FIG. 5C, fin 540 and (if still present) hardmask 524 are covered with a masking layer 550. Additionally, masking layer 530 is removed from the central region and the portions of layers 514 and 512 not protected by masking layer 550 or remaining portions of 530 are then patterned to have the pattern of hardmask 522 and to form fin 542. However, the etch is not performed on layers 504, 506, 508 or 510.

Figure 5D:
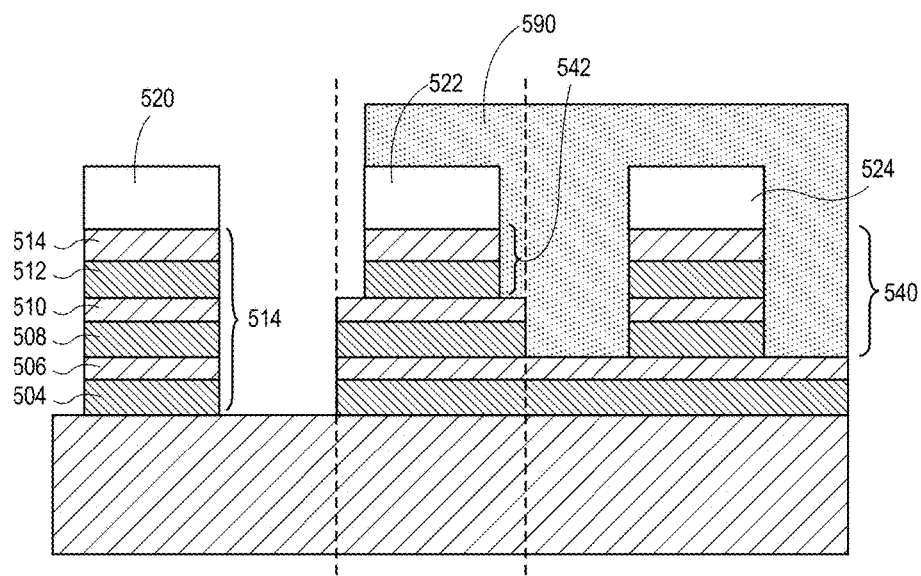

Referring to FIG. 5D, fin 542 and (if still present) hardmask 522 are covered with a masking layer 590. Additionally, masking layer 530/550 is removed from the left region and the portions of layers 504-514 not protected by masking layer 590 or remaining portions of 550 are then patterned to have the pattern of hardmask 520 and to form fin 544.

Figure 5E:
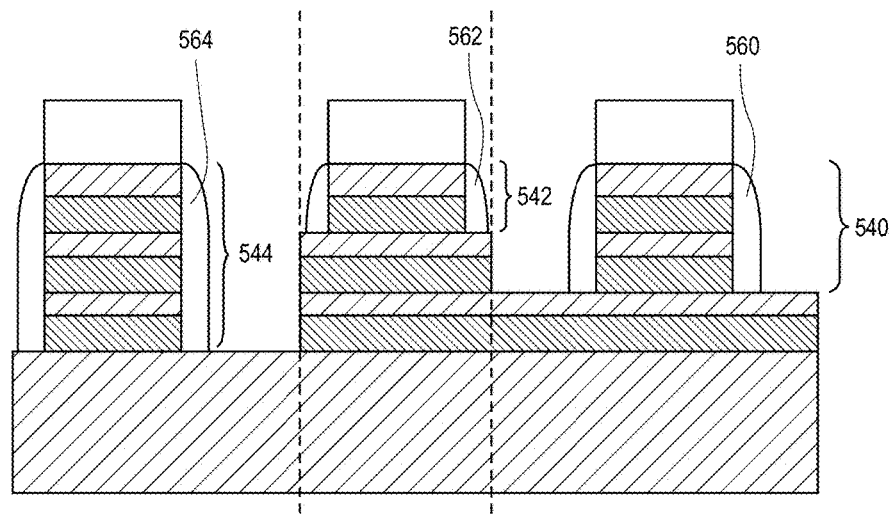
Figure 5F:
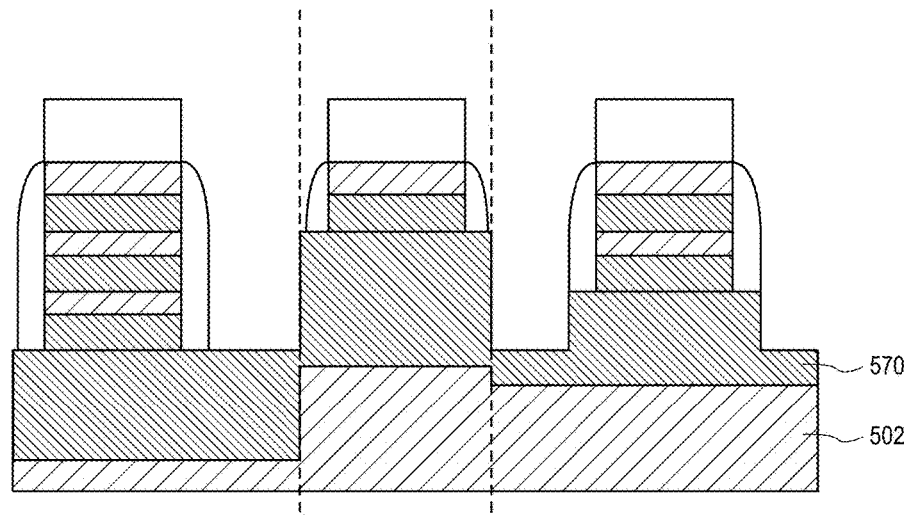

Referring to FIG. 5E, any remaining portions of the masking layers are removed and a first set of dielectric spacers 560 is formed along the sidewalls of fin 540, a second set of dielectric spacers 562 is formed along the sidewalls of fin 542, and a third set of dielectric spacers 564 is formed along the sidewalls of fin 544. It is to be understood that, in the case where the structures are directly adjacent, a sidewall spacer may form along the sidewalls of the exposed portions of layers 204, 206, 208 and 210. The exposed portions of layers 504, 506, 508 and 510 (those portions not protected by spacers 560, 562 or 564), along with a top portion of substrate 502, are then oxidized to form an intervening dielectric layer 570, as depicted in FIG. 5F.

Figure 5G:
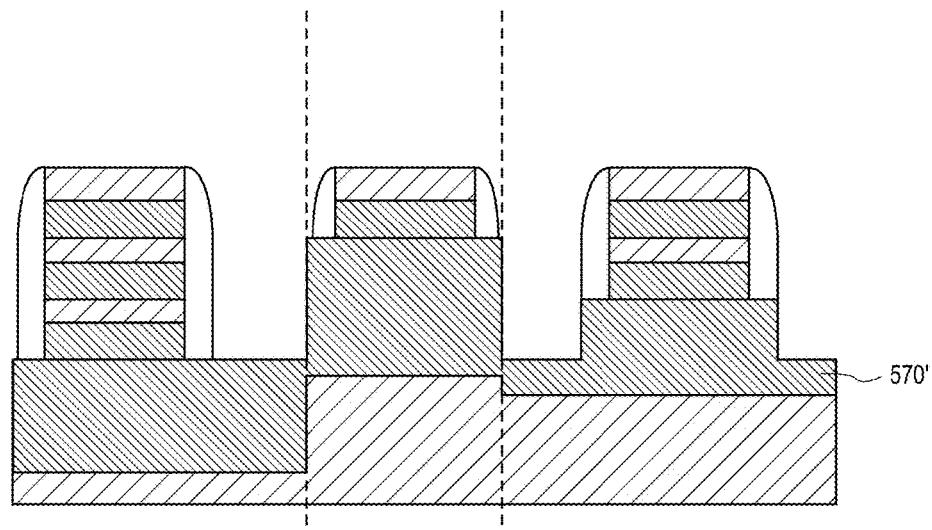
Figure 5H:
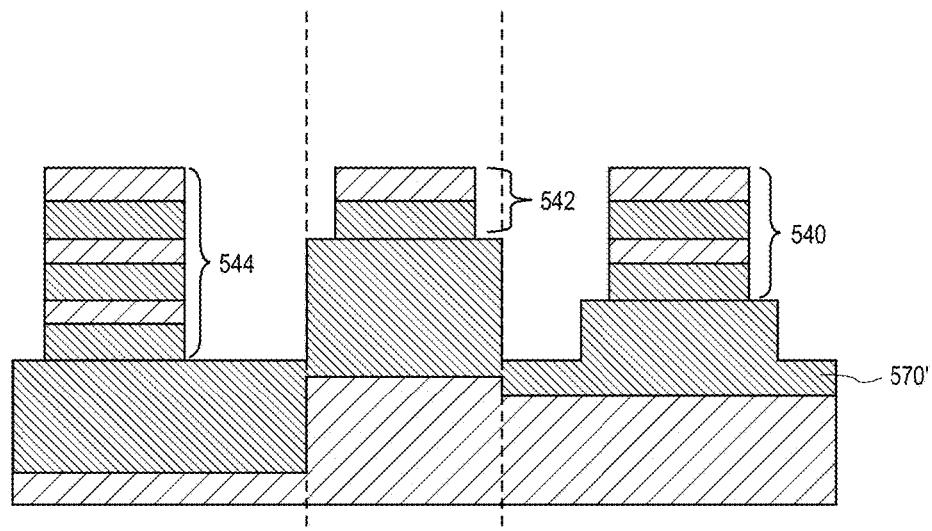

An oxide fill and recess with planarization may then be performed to provide modified intervening dielectric layer 570', as depicted in FIG. 5G. Then, referring to FIG. 5H, any remaining hardmask layers and sidewall spacers are removed to provide fins 540, 542 and 544 above modified intervening dielectric layer 570'.

Accordingly, more than two devices having differing nanowire counts, such as three different devices each with a different nanowire count, may be formed on a common substrate. For example, in an embodiment, the structure shown in FIG. 5H may be used to fabricate three different nanowire devices. In one such embodiment, a semiconductor structure includes a first semiconductor device having a first plurality of nanowires disposed above a substrate and stacked in a first vertical plane with a first uppermost nanowire. A second semiconductor device has a second plurality of nanowires disposed above the substrate and stacked in a second vertical plane with a second uppermost nanowire. The second semiconductor device includes one or more fewer nanowires than the first semiconductor device. A third semiconductor device has one or more nanowires disposed above the substrate and stacked in a third vertical plane with a third uppermost nanowire. The third semiconductor device includes one or more fewer nanowires than the second semiconductor device. The first, second and third uppermost nanowires are disposed in a same plane orthogonal to the first, second and third vertical planes.

In an embodiment, each of the nanowires has a discrete channel region. In one such embodiment, each of the nanowires also has a pair of discrete source and drain regions. In an alternative embodiment, however, the first plurality of nanowires of the first semiconductor device has a first pair of non-discrete source and drain regions, the second plurality of nanowires of the second semiconductor device has a second pair of non-discrete source and drain regions, and the one or more nanowires of the third semiconductor device has a third pair of non-discrete source and drain regions.

In an embodiment, the semiconductor structure further includes an intervening dielectric layer disposed between the substrate and the first, second and third semiconductor devices. The intervening dielectric layer is thicker between the substrate and the third semiconductor device than between the substrate and the first and second semiconductor devices. The intervening dielectric layer is also thicker between the substrate and the second semiconductor device than between the substrate and the first semiconductor device.

In an embodiment, the first semiconductor device further includes a first gate electrode stack surrounding a portion of each of the first plurality of nanowires, the second semiconductor device further includes a second gate electrode stack surrounding a portion of each of the second plurality of nanowires, and the third semiconductor device further includes a third gate electrode stack surrounding a portion of each of the one or more nanowires. In one such embodiment, the first, second and third gate electrode stacks each are composed of a high-K gate dielectric layer and a metal gate electrode layer.

In an embodiment, each of the nanowires of the semiconductor structure are composed of silicon, and the first, second and third semiconductor devices are NMOS devices. In another embodiment, each of the nanowires of the semiconductor structure are composed of silicon germanium, and the first, second and third semiconductor devices are PMOS devices. In an embodiment, the first, second and third vertical planes are parallel to one another. In an embodiment, the third semiconductor device is disposed between the first and second semiconductor devices.

In an embodiment, the first semiconductor device further includes first and second contacts surrounding respective portions of each of the first plurality of nanowires, the second semiconductor device further includes third and fourth contacts surrounding respective portions of each of the second plurality of nanowires, and the third semiconductor device further includes fifth and sixth contacts surrounding respective portions of each of the one or more nanowires. In one such embodiment, the first semiconductor device further includes first and second spacers disposed between the first gate electrode stack and the first and second contacts, respectively. The second semiconductor device further includes third and fourth spacers disposed between the second gate electrode stack and the third and fourth contacts, respectively. And the third semiconductor device further includes fifth and sixth spacers disposed between the third gate electrode stack and the fifth and sixth contacts, respectively.

Accordingly, one or more embodiments described herein target nanowire count modulation through a bottom-up approach. That is, each device has a top nanowire in the same plane as the top nanowire of other devices, even though counts may vary. As such, the difference occurs in how proximate the bottom nanowire of each device is to an underlying common substrate. The bottom-up approach, as opposed to a top-down nanowire removal approach may prove to provide the best performance. For example, FEM circuits may exhibit an advantage in delay and power for bottom up approach (e.g., through delay increase relative to a full fin or power reduction relative to full fin. Embodiments described herein may enable improved performance on 14 nm node products and reduce standby leakage, e.g. for 14 nm node system-on-chip (SOC) products with extremely stringent standby power requirements. Embodiments described herein may allow better cell rebalancing and so reduction of Vccmin. Additionally, one or more embodiments of the present invention include use of an under fin oxide (UFO) process methodology to modulate the height of the active diffusion area.

Figure 6:
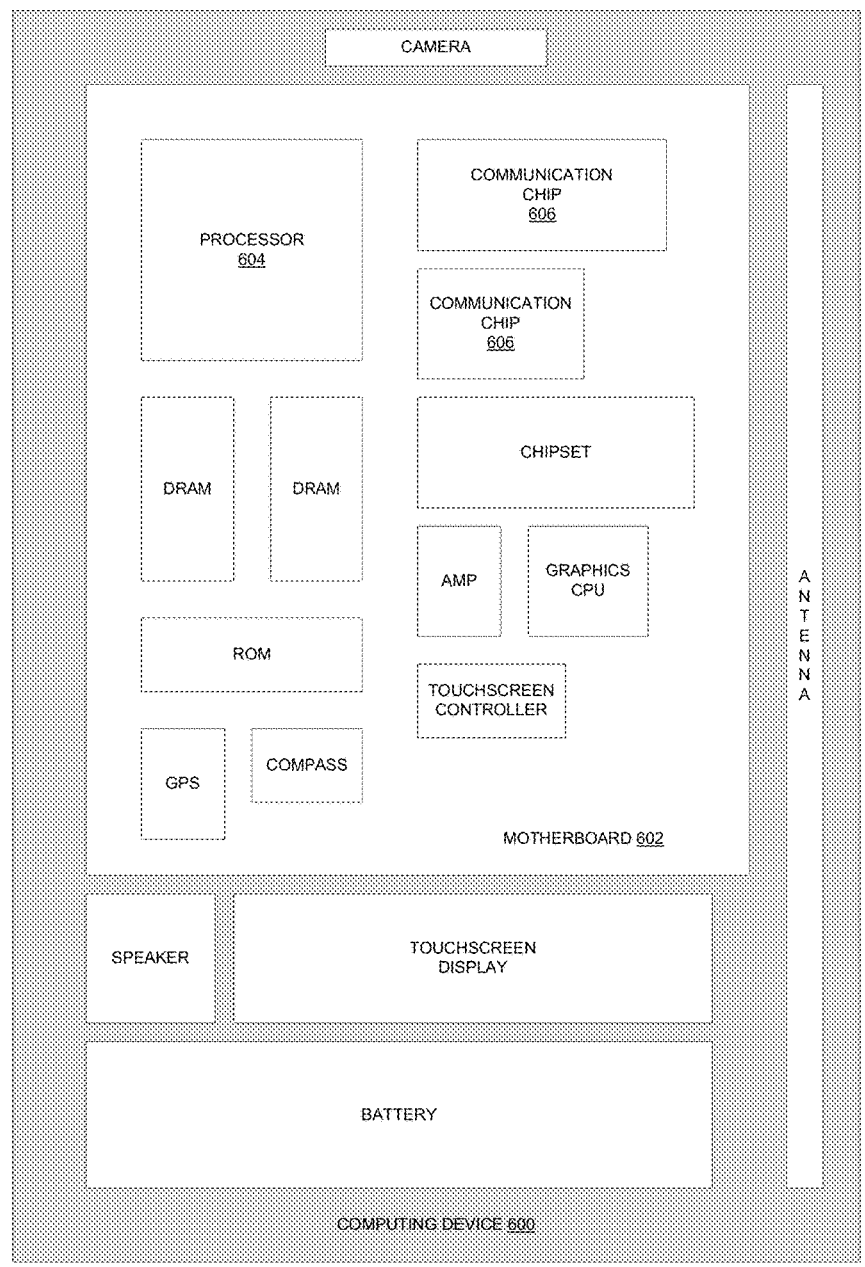
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, semiconductor devices having modulated nanowire counts and methods to form such devices have been disclosed. In an embodiment, a semiconductor structure includes a first semiconductor device having a plurality of nanowires disposed above a substrate and stacked in a first vertical plane with a first uppermost nanowire. A second semiconductor device has one or more nanowires disposed above the substrate and stacked in a second vertical plane with a second uppermost nanowire. The second semiconductor device includes one or more fewer nanowires than the first semiconductor device. The first and second uppermost nanowires are disposed in a same plane orthogonal to the first and second vertical planes. In one embodiment, the first and second vertical planes are parallel to one another.

What is claimed is:

1. A semiconductor structure, comprising:
 a first semiconductor device comprising a plurality of nanowires disposed above a substrate and stacked in a first vertical plane with a first uppermost nanowire; and
 a second semiconductor device comprising one or more nanowires disposed above the substrate and stacked in a second vertical plane with a second uppermost nanowire, the second semiconductor device comprising one or more fewer nanowires than the first semiconductor device, and the first and second uppermost nanowires disposed in a same plane orthogonal to the first and second vertical planes.

2. The semiconductor structure of claim 1, wherein each of the nanowires comprises a discrete channel region.

3. The semiconductor structure of claim 2, wherein each of the nanowires comprises a pair of discrete source and drain regions.

4. The semiconductor structure of claim 2, wherein the plurality of nanowires of the first semiconductor device comprises a first pair of non-discrete source and drain regions, and the one or more nanowires of the second semiconductor device comprises a second pair of non-discrete source and drain regions.

5. The semiconductor structure of claim 1, further comprising:
 an intervening dielectric layer disposed between the substrate and the first and second semiconductor devices, the intervening dielectric layer thicker between the substrate and the second semiconductor device than between the substrate and the first semiconductor device.

6. The semiconductor structure of claim 1, wherein the first semiconductor device further comprises a first gate electrode stack surrounding a portion of each of the plurality of nanowires, and the second semiconductor device further comprises a second gate electrode stack surrounding a portion of each of the one or more nanowires.

7. The semiconductor structure of claim 6, wherein the first and second gate electrode stacks each comprise a high-K gate dielectric layer and a metal gate electrode layer.

8. The semiconductor structure of claim 1, wherein each of the nanowires consists essentially of silicon, and the first and second semiconductor devices are NMOS devices.

9. The semiconductor structure of claim 1, wherein each of the nanowires consists essentially of silicon germanium, and the first and second semiconductor devices are PMOS devices.

10. The semiconductor structure of claim 1, wherein the first and second vertical planes are parallel to one another.

11. The semiconductor structure of claim 6, wherein the first semiconductor device further comprises first and second contacts surrounding respective portions of each of the plurality of nanowires, and the second semiconductor device further comprises third and fourth contacts surrounding respective portions of each of the one or more nanowires.

12. The semiconductor structure of claim 11, wherein the first semiconductor device further comprises first and second spacers disposed between the first gate electrode stack and the first and second contacts, respectively, and wherein the second semiconductor device further comprises third and fourth spacers disposed between the second gate electrode stack and the third and fourth contacts, respectively.

13. A semiconductor structure, comprising:
 a first semiconductor device comprising a first plurality of nanowires disposed above a substrate and stacked in a first vertical plane with a first uppermost nanowire;
 a second semiconductor device comprising a second plurality of nanowires disposed above the substrate and stacked in a second vertical plane with a second uppermost nanowire, the second semiconductor device comprising one or more fewer nanowires than the first semiconductor device; and
 a third semiconductor device comprising one or more nanowires disposed above the substrate and stacked in a third vertical plane with a third uppermost nanowire, the third semiconductor device comprising one or more fewer nanowires than the second semiconductor device, and the first, second and third uppermost nanowires disposed in a same plane orthogonal to the first, second and third vertical planes.

14. The semiconductor structure of claim 13, wherein each of the nanowires comprises a discrete channel region.

15. The semiconductor structure of claim 14, wherein each of the nanowires comprises a pair of discrete source and drain regions.

16. The semiconductor structure of claim 14, wherein the first plurality of nanowires of the first semiconductor device comprises a first pair of non-discrete source and drain regions, the second plurality of nanowires of the second semiconductor device comprises a second pair of non-discrete source and drain regions, and the one or more nanowires of the third semiconductor device comprises a third pair of non-discrete source and drain regions.

17. The semiconductor structure of claim 13, further comprising:
 an intervening dielectric layer disposed between the substrate and the first, second and third semiconductor devices, the intervening dielectric layer thicker between the substrate and the third semiconductor device than between the substrate and the first and second semiconductor devices, and thicker between the substrate and the second semiconductor device than between the substrate and the first semiconductor device.

18. The semiconductor structure of claim 13, wherein the first semiconductor device further comprises a first gate electrode stack surrounding a portion of each of the first plurality of nanowires, the second semiconductor device further comprises a second gate electrode stack surrounding a portion of each of the second plurality of nanowires, and the third semiconductor device further comprises a third gate electrode stack surrounding a portion of each of the one or more nanowires.

19. The semiconductor structure of claim 18, wherein the first, second and third gate electrode stacks each comprise a high-K gate dielectric layer and a metal gate electrode layer.

20. The semiconductor structure of claim 13, wherein each of the nanowires consists essentially of silicon, and the first, second and third semiconductor devices are NMOS devices.

21. The semiconductor structure of claim 13, wherein each of the nanowires consists essentially of silicon germanium, and the first, second and third semiconductor devices are PMOS devices.

22. The semiconductor structure of claim 13, wherein the first, second and third vertical planes are parallel to one another.

23. The semiconductor structure of claim 18, wherein the first semiconductor device further comprises first and second contacts surrounding respective portions of each of the first plurality of nanowires, the second semiconductor device further comprises third and fourth contacts surrounding respective portions of each of the second plurality of nanowires, and the third semiconductor device further comprises fifth and sixth contacts surrounding respective portions of each of the one or more nanowires.

24. The semiconductor structure of claim 23, wherein the first semiconductor device further comprises first and second spacers disposed between the first gate electrode stack and the first and second contacts, respectively, wherein the second semiconductor device further comprises third and fourth spacers disposed between the second gate electrode stack and the third and fourth contacts, respectively, and wherein the third semiconductor device further comprises fifth and sixth spacers disposed between the third gate electrode stack and the fifth and sixth contacts, respectively.

25. The semiconductor structure of claim 13, wherein the third semiconductor device is disposed between the first and second semiconductor devices.

* * * * *